United States Patent
Zhang

(10) Patent No.: US 10,505,154 B2
(45) Date of Patent: *Dec. 10, 2019

(54) MANUFACTURING METHOD OF ORGANIC LIGHT EMITTING DIODE DISPLAY PANEL AND ORGANIC LIGHT EMITTING DIODE DISPLAY PANEL

(71) Applicant: Shenzhen China Star Optoelectronics Technology Co., Ltd., Shenzhen (CN)

(72) Inventor: Yunan Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 12 days.

This patent is subject to a terminal disclaimer.

(21) Appl. No.: 15/557,132

(22) PCT Filed: Jul. 13, 2017

(86) PCT No.: PCT/CN2017/092680
§ 371 (c)(1),
(2) Date: Sep. 11, 2017

(87) PCT Pub. No.: WO2018/218740
PCT Pub. Date: Dec. 6, 2018

(65) Prior Publication Data
US 2018/0342706 A1   Nov. 29, 2018

(30) Foreign Application Priority Data

May 27, 2017   (CN) .......................... 2017 1 0393572

(51) Int. Cl.
*H01L 51/56*   (2006.01)
*H01L 51/00*   (2006.01)
(Continued)

(52) U.S. Cl.
CPC .......... *H01L 51/56* (2013.01); *H01L 51/0005* (2013.01); *H01L 51/5008* (2013.01); *H01L 27/3246* (2013.01); *H01L 2251/5369* (2013.01)

(58) Field of Classification Search
CPC ............. H01L 51/5012; H01L 51/0097; H01L 51/5056; H01L 51/5072; H01L 51/5206; H01L 51/5221; H01L 51/5237
(Continued)

(56) References Cited

U.S. PATENT DOCUMENTS

2009/0267499 A1* 10/2009 Qiu .................... H01L 51/5092
                                                    313/504
2012/0313129 A1   12/2012 Zettsu et al.
(Continued)

FOREIGN PATENT DOCUMENTS

CN         1400106 A      3/2003
CN        101132055 A     2/2008
(Continued)

*Primary Examiner* — Long K Tran
(74) *Attorney, Agent, or Firm* — Leong C. Lei

(57) ABSTRACT

The present invention provides a manufacturing method of an OLED display panel and an OLED display panel. The manufacturing method of the OLED display panel of the present invention manufactures a metal nano self assembled layer by ink jet printing with a metal nano printing liquid. The metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles. With applying the configuration of the metal nano self assembled layer in the OLED element, the overall performance of OLED element can be effectively promoted and the manufacturing method is simple.

8 Claims, 3 Drawing Sheets

(51) Int. Cl.
  *H01L 51/50*   (2006.01)
  *H01L 27/32*   (2006.01)
(58) Field of Classification Search
  USPC .......................................................... 257/40
  See application file for complete search history.

(56) References Cited

U.S. PATENT DOCUMENTS

2014/0242354 A1\* 8/2014 Ro ........................ H01L 51/448
                                                      428/195.1
2016/0087225 A1\* 3/2016 Kim .................... H01L 51/0072
                                                      257/40

FOREIGN PATENT DOCUMENTS

| CN | 104724660 A | 6/2015 |
| CN | 104993065 A | 10/2015 |
| CN | 105047827 A | 11/2015 |
| CN | 105788756 A | 7/2016 |
| CN | 106340533 A | 1/2017 |

\* cited by examiner

MANUFACTURING METHOD OF ORGANIC LIGHT EMITTING DIODE DISPLAY PANEL AND ORGANIC LIGHT EMITTING DIODE DISPLAY PANEL

FIELD OF THE INVENTION

The present invention relates to a display field, more particularly to a manufacturing method of an organic light emitting diode display panel and an organic light emitting diode display panel.

BACKGROUND OF THE INVENTION

The Organic Light Emitting Display (OLED) possesses many outstanding properties of self-illumination, low driving voltage, high luminescence efficiency, short response time, high clarity and contrast, near 180 degree view angle, wide range of working temperature, applicability of flexible display and large scale full color display. The OLED is considered as the most potential display panel.

The OLED display element generally comprises a substrate, an anode located on the substrate, a hole injection layer located on the anode, a hole transporting layer located on the hole injection layer, an emitting layer located on the hole transporting layer, an electron transporting layer located on the emitting layer, an electron injection layer located on the electron transporting layer and a cathode located on the electron injection layer. The principle of the OLED element is that the illumination generates due to the carrier injection and recombination under the electric field driving of the semiconductor material and the organic semiconductor illuminating material. Specifically, the ITO pixel electrode and the metal electrode are respectively employed as the anode and the cathode of the OLED element. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

The Ink-jet Printing (IJP) has advantages of high material utilization, which is the key of solving the cost issue of the large scale OLED display. In comparison with the traditional vacuum evaporation of prior art, the IJP skill possesses many advantages of material saving, gentle process condition and more uniform film formation and thus has more potential applications. The method is to drop the function material ink into the predetermined pixel areas with a plurality of nozzles. Then, the required pattern is formed after the solvent is evaporated.

The metal nanoparticles provide many excellent optical and electrical properties with their special volume effect, quantum size effect, surface effect and macroscopic quantum tunneling effect.

SUMMARY OF THE INVENTION

An objective of the present invention is to provide a manufacturing method of an OLED display panel, which can effectively promote the overall performance of OLED element and the manufacturing method is simple.

Another objective of the present invention is to provide an OLED display panel, which can effectively promote the overall performance of OLED element and the manufacturing method is simple.

For realizing the aforesaid objective, the present invention provides a manufacturing method of an organic light emitting diode display panel, wherein the organic light emitting diode display panel comprises a substrate and a plurality of organic light emitting diode elements configured on the substrate, the organic light emitting diode element comprises an anode, a light emitting layer and a cathode from bottom to top in order, a metal nano self assembled layer is configured between the anode and the light emitting layer, at least one of a hole injection layer and a hole transporting layer is configured between the metal nano self assembled layer and the light emitting layer; wherein a manufacturing method of the metal nano self assembled layer comprises: providing a metal nano printing liquid, wherein the metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the metal nano printing liquid on the anode by ink jet printing to form the metal nano self assembled layer.

The metal nanoparticles are gold nanoparticles, silver nanoparticles or copper nanoparticles; the metal nanoparticles are metal nanoparticles which are modified by organic amine in the metal nano printing liquid.

The surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines.

In the organic light emitting diode element, at least one of an electron injection layer and an electron transporting layer is configured between the cathode and the light emitting layer.

In one preferred embodiment of the present invention, the manufacturing method of the organic light emitting diode display panel comprises steps of:

Step S1, providing the substrate and forming a pixel definition layer on the substrate, wherein a plurality of through holes are spaced and configured in the pixel definition layer; a plurality of anodes are respectively formed in the plurality of through holes;

Step S2, providing the metal nano printing liquid and coating the metal nano printing liquid on the plurality of anodes by ink jet printing to respectively obtain a plurality of metal nano self assembled layers;

Step S3, respectively forming a plurality of hole injection layers on the plurality of metal nano self assembled layers and respectively forming a plurality of light emitting layers on the plurality of hole injection layers; respectively forming a plurality of electron injection layers on the plurality of light emitting layers; respectively forming a plurality of cathodes on the plurality of electron injection layers; and respectively forming the plurality of organic light emitting diode elements in the plurality of through holes in the pixel definition layer.

In Step S1, the anodes are formed by magnetron sputtering and a material of the anodes is a transparent conductive metal oxide substance;

in Step S3, the hole injection layers and the light emitting layers are formed by ink jet printing; a material of the hole injection layers is PEDOT:PSS; a material of the light emitting layers comprises poly(9,9-noctylfluorene-2,7-diyl);

in Step S3, the electron injection layers and the cathodes are formed by vacuum evaporation; a material of the electron injection layers comprises lithium fluoride; a material of the cathodes comprises aluminum.

The present invention further provides an organic light emitting diode display panel, comprising a substrate and a plurality of organic light emitting diode elements configured on the substrate, the organic light emitting diode element comprises an anode, a light emitting layer and a cathode from bottom to top in order, a metal nano self assembled layer is configured between the anode and the light emitting layer, at least one of a hole injection layer and a hole transporting layer is configured between the metal nano self assembled layer and the light emitting layer; wherein the metal nano self assembled layer is formed by ink jet printing with a metal nano printing liquid, wherein the metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles.

The metal nanoparticles are gold nanoparticles, silver nanoparticles or copper nanoparticles; the metal nanoparticles are metal nanoparticles which are modified by organic amine in the metal nano printing liquid; The surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines.

The organic light emitting diode display panel further comprises a pixel definition layer configured on the substrate, wherein a plurality of through holes are spaced and configured in the pixel definition layer and the plurality of organic light emitting diode elements are respectively arranged in the plurality of through holes;

the organic light emitting diode element comprises an anode, a metal nano self assembled layer, a hole injection layer, a light emitting layer, an electron injection layer and a cathode from bottom to top in order.

A material of the anodes is a transparent conductive metal oxide substance; a material of the hole injection layers is PEDOT:PSS; a material of the light emitting layers comprises poly(9,9-noctylfluorene-2,7-diyl); a material of the electron injection layers comprises lithium fluoride; a material of the cathodes comprises aluminum.

The present invention further provides a manufacturing method of an organic light emitting diode display panel, wherein the organic light emitting diode display panel comprises a substrate and a plurality of organic light emitting diode elements configured on the substrate, the organic light emitting diode element comprises an anode, a light emitting layer and a cathode from bottom to top in order, a metal nano self assembled layer is configured between the anode and the light emitting layer, at least one of a hole injection layer and a hole transporting layer is configured between the metal nano self assembled layer and the light emitting layer; wherein a manufacturing method of the metal nano self assembled layer comprises: providing a metal nano printing liquid, wherein the metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the metal nano printing liquid on the anode by ink jet printing to form the metal nano self assembled layer; wherein the metal nanoparticles are gold nanoparticles, silver nanoparticles or copper nanoparticles; the metal nanoparticles are metal nanoparticles which are modified by organic amine in the metal nano printing liquid; wherein the surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines; wherein in the organic light emitting diode element, at least one of an electron injection layer and an electron transporting layer is configured between the cathode and the light emitting layer; wherein, the method specifically comprises steps of:

Step S1, providing the substrate and forming a pixel definition layer on the substrate, wherein a plurality of through holes are spaced and configured in the pixel definition layer; a plurality of anodes are respectively formed in the plurality of through holes;

Step S2, providing the metal nano printing liquid and coating the metal nano printing liquid on the plurality of anodes by ink jet printing to respectively obtain a plurality of metal nano self assembled layers;

Step S3, respectively forming a plurality of hole injection layers on the plurality of metal nano self assembled layers and respectively forming a plurality of light emitting layers on the plurality of hole injection layers; respectively forming a plurality of electron injection layers on the plurality of light emitting layers; respectively forming a plurality of cathodes on the plurality of electron injection layers; and respectively forming the plurality of organic light emitting diode elements in the plurality of through holes in the pixel definition layer.

The benefits of the present invention are: the manufacturing method of the OLED display panel of the present invention manufactures a metal nano self assembled layer by ink jet printing with a metal nano printing liquid. The metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles. With applying the configuration of the metal nano self assembled layer in the OLED element, the overall performance of OLED element can be effectively promoted and the manufacturing method is simple. In the OLED display panel of the present invention, a metal nano self assembled layer is configured between the anode and the light emitting layer of the OLED element. The metal nano self assembled layer is formed by ink jet printing with a metal nano printing liquid. The metal nano printing liquid comprises surface-modified metal nanoparticles, a surface tension modifier and a viscosity modifier. By applying the metal nano self assembled layer to the OLED element, the overall performance of OLED element can be effectively promoted and the manufacturing method is simple.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

Figure 1:
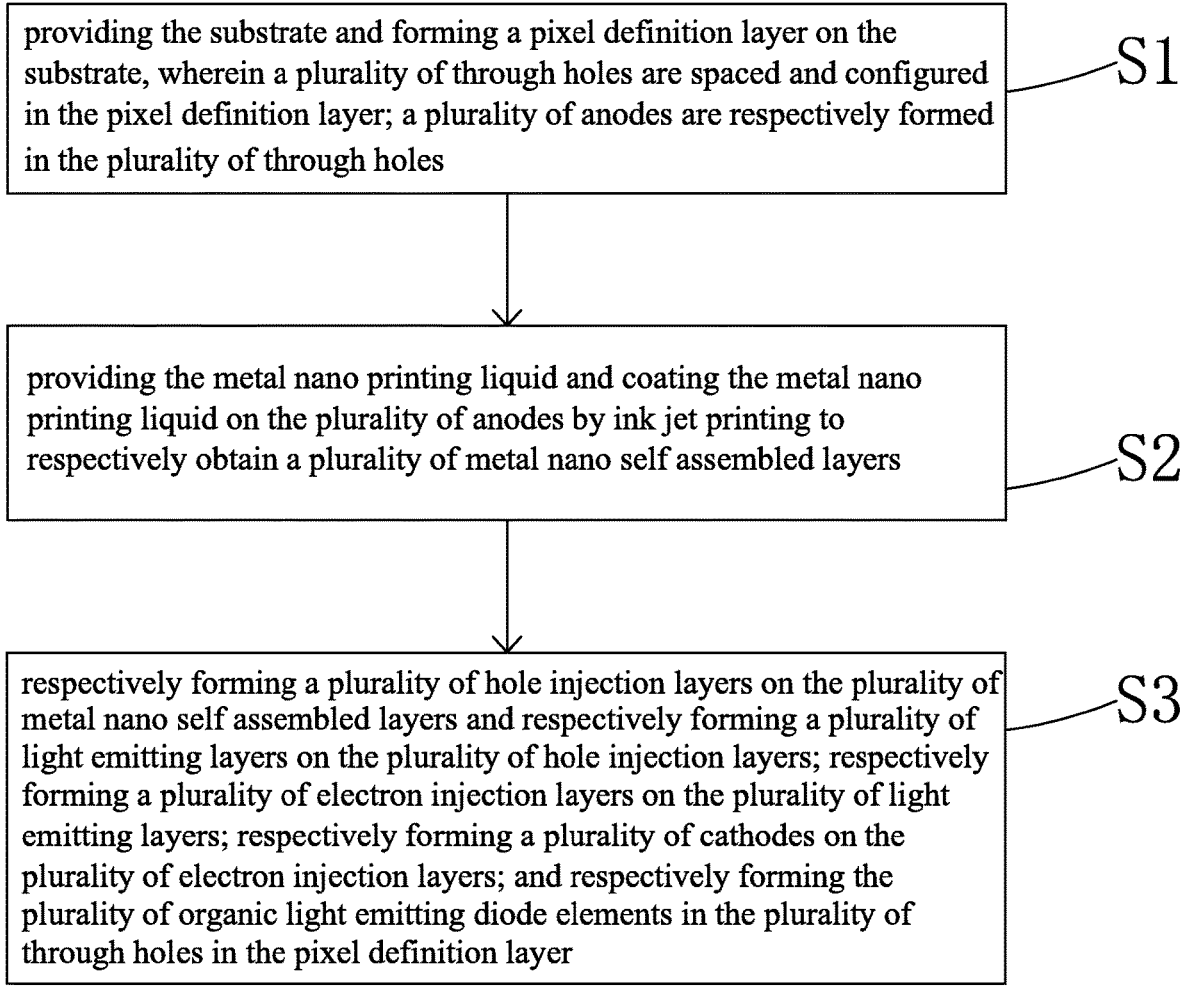
FIG. 1 is a flowchart of a preferred embodiment of a manufacturing method of an organic light emitting diode display panel according to the present invention.

For better explaining the technical solution and the effect of the present invention, the present invention will be further described in detail with the accompanying drawings and the specific embodiments.

The present invention first provides a manufacturing method of an organic light emitting diode display panel, wherein the organic light emitting diode display panel comprises a substrate 10 and a plurality of organic light emitting diode elements 30 configured on the substrate 10, the organic light emitting diode element 30 comprises an anode 31, a light emitting layer 32 and a cathode 33 from bottom to top in order, a metal nano self assembled layer 34 is configured between the anode 31 and the light emitting layer 32, at least one of a hole injection layer and a hole transporting layer is configured between the metal nano self assembled layer 34 and the light emitting layer 32; wherein a manufacturing method of the metal nano self assembled layer 34 comprises: providing a metal nano printing liquid, wherein the metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the metal nano printing liquid on the anode 31 by ink jet printing to form the metal nano self assembled layer 34.

Specifically, the metal in the metal nanoparticles is gold, silver or copper i.e. the metal nanoparticles are gold nanoparticles, silver nanoparticles or copper nanoparticles.

Specifically, the surfaces of the metal nanoparticles have organic amine ligands, i.e. the metal nanoparticles are metal nanoparticles which are modified by organic amine in the metal nano printing liquid. On one hand, the long chain organic amine ligands can effectively inhibit agglomeration among the metal nanoparticles to reduce carrier traps on the metal nanoparticles; on the other hand, the introduction of the organic amine ligands can enhance the solubility of the metal nanoparticles in a common organic solvent so that the prepared metal nanoparticles can be better applied to the solution processing process. Preferably, the organic amine is a long chain alkylamine having a carbon chain length larger than or equal to 16.

Specifically, the surface tension modifier is a combination of one or more of a co-solvent, a surfactant, an imidazole and a derivative thereof, phenol, and hydroquinone; the viscosity modifier is a combination of one or more of alcohols, ethers, esters, phenols and amines. For instance, the viscosity modifier can be polyhydric alcohol or glycol ether.

Specifically, in the organic light emitting diode element 30, at least one of an electron injection layer and an electron transporting layer is configured between the cathode 33 and the light emitting layer 32.

Figure 2:
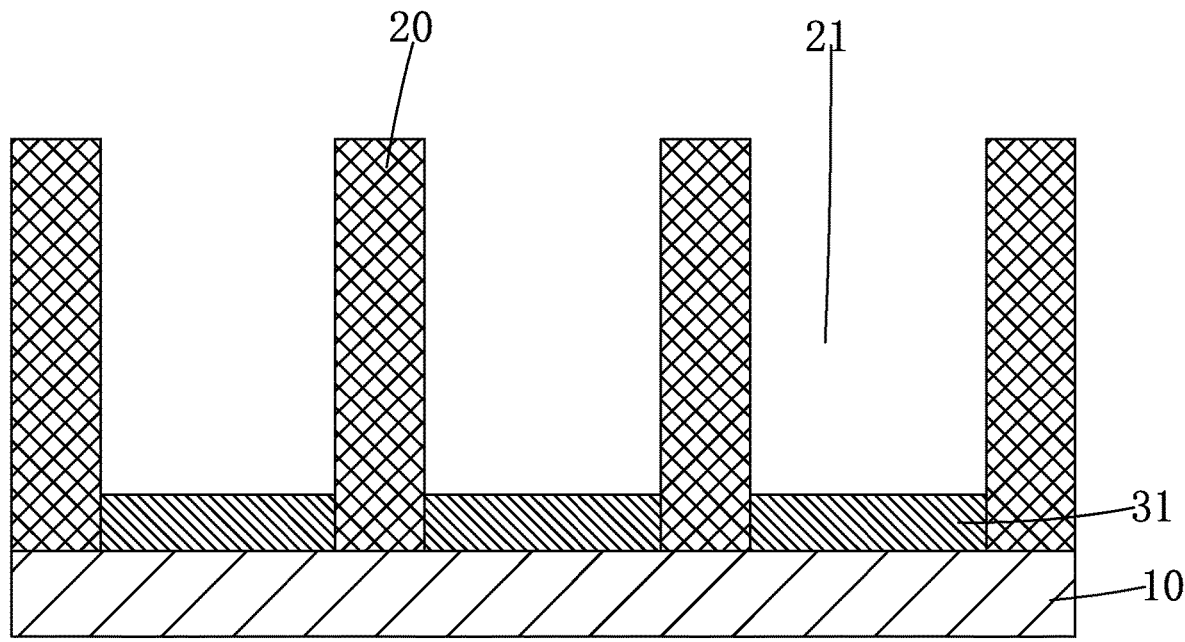
FIG. 2 is a diagram of Step S1 of a preferred embodiment of a manufacturing method of an organic light emitting diode display panel according to the present invention.

Specifically, as shown in FIG. 1, which is a flowchart of a preferred embodiment of a manufacturing method of an organic light emitting diode display panel according to the present invention and comprises steps of:

Step 1, as shown in FIG. 2, providing the substrate 10 and forming a pixel definition layer 20 on the substrate 10, wherein a plurality of through holes 21 are spaced and configured in the pixel definition layer 20; a plurality of anodes 31 are respectively formed in the plurality of through holes 21.

Specifically, the substrate 10 is a substrate with a TFT array.

Specifically, in Step S1, the anodes 31 are formed by magnetron sputtering and a material of the anodes 31 is a transparent conductive metal oxide substance and preferably is Indium Tin Oxide (ITO).

Specifically, a thickness of the anodes 31 is in a range of 20 nm to 200 nm.

Figure 3:
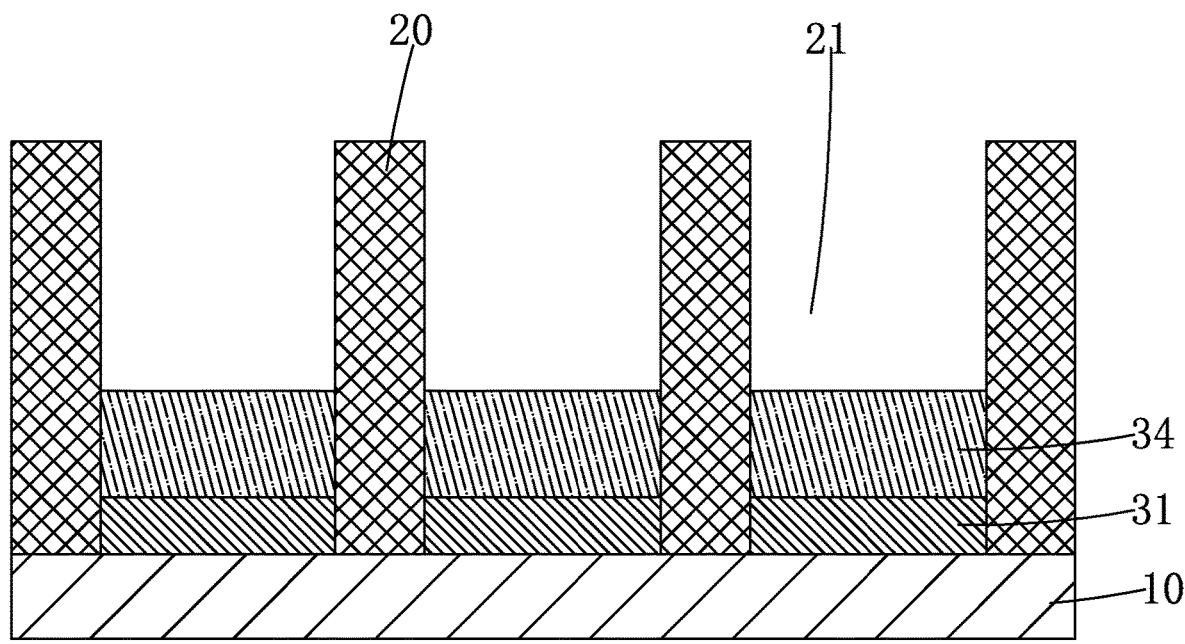
FIG. 3 is a diagram of Step S2 of a preferred embodiment of a manufacturing method of an organic light emitting diode display panel according to the present invention.

Step S2, as shown in FIG. 3, providing the metal nano printing liquid and coating the metal nano printing liquid on the plurality of anodes 31 by ink jet printing to respectively obtain a plurality of metal nano self assembled layers 34.

Specifically, a thickness of the metal nano self assembled layers 34 is in a range of 1 nm to 100 nm.

Specifically, in Step S2, the metal nanoparticles in the metal nano self assembled layer 34 are gold nanoparticles. The specific manufacturing process of the metal nano printing liquid is:

1. preparation of gold nanoparticles which are modified by organic amine and the solution thereof:

1.1 dissolving gold chloride ($AuCl_3$) in the solvent of the alkylamine.

1.2 vacuuming the system first and then, passing nitrogen, repeating the aforesaid steps three times to remove water and oxygen in the system.

1.3 heating to the system reflux, heating and stirring to complete reaction and cooling to the room temperature to obtain the gold nanoparticles which are modified by organic amine and the solution thereof.

2. adding a surface tension modifier and a viscosity modifier in the aforesaid prepared gold nanoparticle solution to adjust the physical properties for being suitable for ink jet printing to obtain the metal nano printing liquid.

Figure 4:
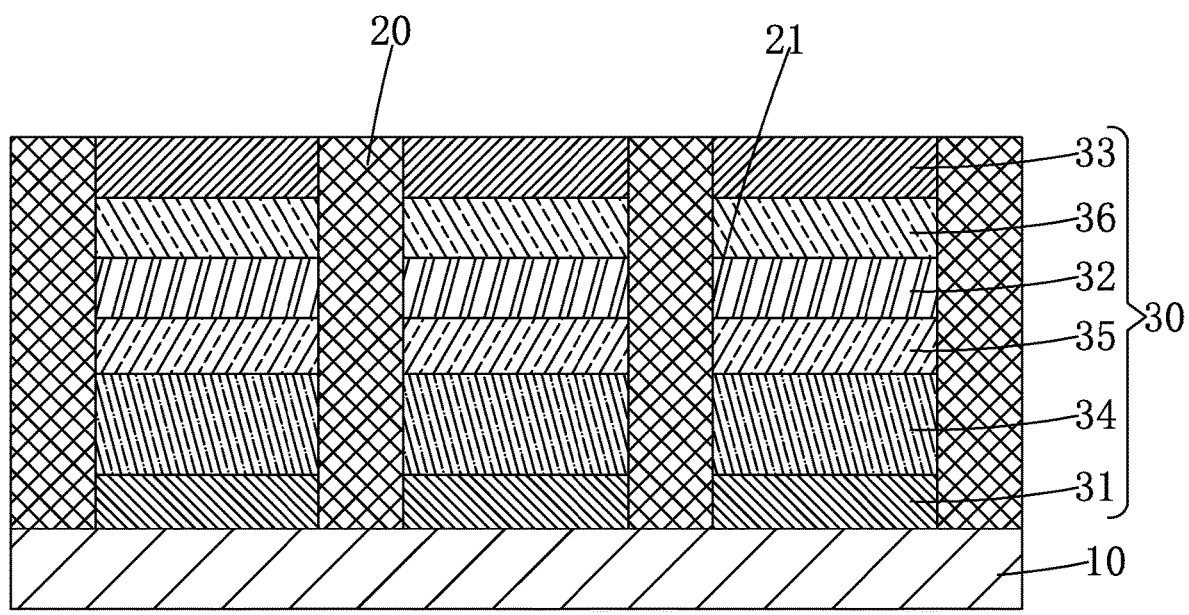
FIG. 4 is a diagram of Step S3 of a preferred embodiment of a manufacturing method of an organic light emitting diode display panel according to the present invention and also a structure diagram of a preferred embodiment of an organic light emitting diode display panel according to the present invention.

Step S3, as shown in FIG. 4, respectively forming a plurality of hole injection layers 35 on the plurality of metal nano self assembled layers 34 and respectively forming a plurality of light emitting layers 32 on the plurality of hole injection layers 35; respectively forming a plurality of electron injection layers 36 on the plurality of light emitting layers 32; respectively forming a plurality of cathodes 33 on the plurality of electron injection layers 36; and respectively forming the plurality of organic light emitting diode elements 30 in the plurality of through holes 21 in the pixel definition layer 20.

Specifically, in Step S3, the hole injection layers and the light emitting layers are formed by ink jet printing; a material of the hole injection layers is PEDOT:PSS; a material of the light emitting layers comprises poly(9,9-noctylfluorene-2,7-diyl) (PFO); the poly(9,9-noctylfluorene-2,7-diyl) is a blue luminescent material; wherein a manufacturing method of the hole injection layers 35 comprises: providing a PEDOT: PSS aqueous solution and coating the PEDOT: PSS aqueous solution on a surface of the metal nano self assembled layers 34 by ink jet printing to form the hole injection layers 35 after volatilization of water.

Specifically, a thickness of the hole injection layers 35 is in a range of 1 nm to 100 nm; a thickness of the light emitting layers 32 is in a range of 1 nm to 100 nm.

Specifically, in Step S3, the electron injection layers 36 and the cathodes 33 are formed by vacuum evaporation; a material of the electron injection layers 36 comprises lithium fluoride (LiF); a material of the cathodes 33 comprises aluminum.

Specifically, a thickness of the electron injection layers 36 is in a range of 0.5 nm to 10 nm; a thickness of the cathodes 33 is in a range of 50 nm to 1000 nm.

The manufacturing method of the OLED display panel of the present invention manufactures the metal nano self assembled layer 34 by ink jet printing to be applied to the OLED element 30. The overall performance of the OLED device 30 can be enhanced by the optical and electrical effects of metal nanoparticles. The main mechanisms of these performance enhancements include surface-enhanced fluorescence, plasma light capture, energy transfer, electrical effects, scattering effects, etc. The manufacturing method of the OLED display panel of the present invention is mainly due to the following three considerations for the configuration of the metal nano self assembled layer 34:

first, with the introduction of the metal nanoparticles between the electrode and the organic layer, the strong local electric field generated with the surface plasma resonance can enhance the injection efficiency of the electrons to improve the performance of the OLED element 30.

Second, the metal nanoparticles can improve the luminescent properties of luminescent materials for two conditions: one is that the surface plasma resonance wavelength of the metal nanoparticles corresponds to the wavelength of the light and the greater the spectrum overlaps, the more obvious the coupling effect is. The other is that a suitable distance should be chosen between the metal nanoparticles and the light emitting layer 32. In case that the distance from the light emitting layer 32 is too far, the surface plasma resonance coupling characteristic does not affect the exciton in the light emitting layer 32 and the coupling effect will not be obvious; in case that the distance from the light emitting layer 32 is too close, the surface of the metal nanoparticles will make the exciton nonradiative quenching more serious to reduce the element performance. By adjusting the surface plasma resonance wavelength of the metal nanoparticles and the distance between the metal nanoparticles and the light emitting 32, the metal nano self assembled layer 34 having the metal nanoparticles can improve the radiance efficiency of the luminescent exciton.

At last, the surface plasma resonance properties of metal nanoparticles can influence the exciton, particularly influence the triplet exciton by coupling effects with the exciton to reduce the exciton caused by the nonradiative attenuation of the exciton (triplet-triplet quenching, triplet-polaron quenching) to improve the efficiency of the phosphorescent element.

On the base of the aforesaid manufacturing method of the organic light emitting diode display panel, the present invention further provides an organic light emitting diode display panel manufactured by the aforesaid manufacturing method of the organic light emitting diode display panel. The method comprises a substrate 10 and a plurality of organic light emitting diode elements 30 configured on the substrate 10, the organic light emitting diode element 30 comprises an anode 31, a light emitting layer 32 and a cathode 33 from bottom to top in order, a metal nano self assembled layer 34 is configured between the anode 31 and the light emitting layer 32, at least one of a hole injection layer and a hole transporting layer is configured between the metal nano self assembled layer 34 and the light emitting layer 32;

the metal nano self assembled layer 34 is formed by ink jet printing with a metal nano printing liquid and the metal nano printing liquid comprises surface-modified metal nanoparticles, a surface tension modifier and a viscosity modifier.

Specifically, the metal in the metal nanoparticles is gold, silver or copper i.e. the metal nanoparticles are gold nanoparticles, silver nanoparticles or copper nanoparticles.

Specifically, the surfaces of the metal nanoparticles have organic amine ligands, i.e. the metal nanoparticles are metal nanoparticles which are modified by organic amine in the metal nano printing liquid to inhibit agglomeration among the metal nanoparticles and to enhance the solubility of the metal nanoparticles. Preferably, the organic amine is a long chain alkylamine having a carbon chain length larger than or equal to 16.

Specifically, the surface tension modifier is a combination of one or more of a co-solvent, a surfactant, an imidazole and a derivative thereof, phenol, and hydroquinone;

the viscosity modifier is a combination of one or more of alcohols, ethers, esters, phenols and amines, such as polyhydric alcohol or glycol ether.

Specifically, as shown in FIG. 4, which is a preferred embodiment of an organic light emitting diode display panel according to the present invention. The organic light emitting diode display panel comprises a substrate 10 and a plurality of organic light emitting diode elements 30 configured on the substrate 10 and a pixel definition layer 20 configured on the substrate 10. A plurality of through holes 21 are spaced and configured in the pixel definition layer 20 and the plurality of organic light emitting diode elements 30 are respectively arranged in the plurality of through holes 21; the organic light emitting diode element 30 comprises a anode 31, a metal nano self assembled layer 34, a hole injection layer 35, a light emitting layer 32, an electron transporting layer 36 and a cathode 33 from bottom to top in order.

Specifically, a material of the anodes 31 is a transparent conductive metal oxide substance; a material of the hole injection layers 35 is PEDOT:PSS; a material of the light emitting layers 32 comprises poly(9,9-noctylfluorene-2,7-diyl); a material of the electron injection layers 36 comprises lithium fluoride; a material of the cathodes 33 comprises aluminum.

In the OLED display panel of the present invention, a metal nano self assembled layer 34 is configured between the anode 31 and the light emitting layer 32 of the OLED element 30. The metal nano self assembled layer 34 is formed by ink jet printing with a metal nano printing liquid. The metal nano printing liquid comprises surface-modified metal nanoparticles, a surface tension modifier and a viscosity modifier. By applying the metal nano self assembled layer 34 to the OLED element 30, the overall performance of OLED element 30 can be effectively promoted and the manufacturing method is simple.

In conclusion, the manufacturing method of the OLED display panel of the present invention manufactures a metal nano self assembled layer by ink jet printing with a metal nano printing liquid. The metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles. With applying the configuration of the metal nano self assembled layer in the OLED element, the overall performance of OLED element can be effectively promoted and the manufacturing method is simple. In the OLED display panel of the present invention, a metal nano self assembled layer is configured between the anode and the light emitting layer of the OLED element. The metal nano self assembled layer is formed by ink jet printing with a metal nano printing liquid. The metal nano printing liquid comprises surface-modified metal nanoparticles, a surface tension modifier and a viscosity modifier. By applying the metal nano self assembled layer to the OLED element, the overall performance of OLED element can be effectively promoted and the manufacturing method is simple.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of an organic light emitting diode display panel, wherein the organic light emitting diode display panel comprises a substrate and a plurality of organic light emitting diode elements configured on the substrate, the organic light emitting diode element comprises an anode, a light emitting layer and a cathode from bottom to top in order, a metal nano self assembled layer is configured between the anode and the light emitting layer, at least one of a hole injection layer and a hole transporting layer is configured between the metal nano self assembled layer and the light emitting layer; wherein
a manufacturing method of the metal nano self assembled layer comprises:
providing a metal nano printing liquid, wherein the metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the metal nano printing liquid on the anode by ink jet printing to form the metal nano self assembled layer.

2. The manufacturing method of the organic light emitting diode display panel according to claim 1, wherein the metal nanoparticles are gold nanoparticles, silver nanoparticles or copper nanoparticles;
the metal nanoparticles are metal nanoparticles which are modified by organic amine in the metal nano printing liquid.

3. The manufacturing method of the organic light emitting diode display panel according to claim 1, wherein the surface tension modifier is a combination of one or more of a co-solvent, a surfactant, an imidazole and a derivative thereof, phenol, and hydroquinone;
the viscosity modifier is a combination of one or more of alcohols, ethers, esters, phenols and amines.

4. The manufacturing method of the organic light emitting diode display panel according to claim 1, wherein in the organic light emitting diode element, at least one of an electron injection layer and an electron transporting layer is configured between the cathode and the light emitting layer.

5. The manufacturing method of the organic light emitting diode display panel according to claim 1, comprising steps of:
Step S1, providing the substrate and forming a pixel definition layer on the substrate, wherein a plurality of through holes are spaced and configured in the pixel definition layer; a plurality of anodes are respectively formed in the plurality of through holes;
Step S2, providing the metal nano printing liquid and coating the metal nano printing liquid on the plurality of anodes by ink jet printing to respectively obtain a plurality of metal nano self assembled layers;
Step S3, respectively forming a plurality of hole injection layers on the plurality of metal nano self assembled layers and respectively forming a plurality of light emitting layers on the plurality of hole injection layers; respectively forming a plurality of electron injection layers on the plurality of light emitting layers; respectively forming a plurality of cathodes on the plurality of electron injection layers; and respectively forming the plurality of organic light emitting diode elements in the plurality of through holes in the pixel definition layer.

6. The manufacturing method of the organic light emitting diode display panel according to claim 5, wherein in Step S1, the anodes are formed by magnetron sputtering and a material of the anodes is a transparent conductive metal oxide substance;
in Step S3, the hole injection layers and the light emitting layers are formed by ink jet printing; a material of the hole injection layers is PEDOT:PSS; a material of the light emitting layers comprises poly(9,9-noctylfluorene-2, 7-diyl);
in Step S3, the electron injection layers and the cathodes are formed by vacuum evaporation; a material of the electron injection layers comprises lithium fluoride; a material of the cathodes comprises aluminum.

7. A manufacturing method of an organic light emitting diode display panel, wherein the organic light emitting diode display panel comprises a substrate and a plurality of organic light emitting diode elements configured on the substrate, the organic light emitting diode element comprises an anode, a light emitting layer and a cathode from bottom to top in order, a metal nano self assembled layer is configured between the anode and the light emitting layer, at least one of a hole injection layer and a hole transporting layer is configured between the metal nano self assembled layer and the light emitting layer; wherein
a manufacturing method of the metal nano self assembled layer comprises:
providing a metal nano printing liquid, wherein the metal nano printing liquid comprises metal nanoparticles, a surface tension modifier and a viscosity modifier, wherein the metal nanoparticles are surface-modified metal nanoparticles to inhibit agglomeration of the metal nanoparticles and to enhance a solubility of the metal nanoparticles; coating the metal nano printing liquid on the anode by ink jet printing to form the metal nano self assembled layer;
wherein the metal nanoparticles are gold nanoparticles, silver nanoparticles or copper nanoparticles;
the metal nanoparticles are metal nanoparticles which are modified by organic amine in the metal nano printing liquid;
wherein the surface tension modifier is a combination of one or more of a co-solvent, a surfactant, an imidazole and a derivative thereof, phenol, and hydroquinone;
the viscosity modifier is a combination of one or more of alcohols, ethers, esters, phenols and amines;
wherein in the organic light emitting diode element, at least one of an electron injection layer and an electron transporting layer is configured between the cathode and the light emitting layer;

wherein, the method specifically comprises steps of:

Step S1, providing the substrate and forming a pixel definition layer on the substrate, wherein a plurality of through holes are spaced and configured in the pixel definition layer; a plurality of anodes are respectively formed in the plurality of through holes;

Step S2, providing the metal nano printing liquid and coating the metal nano printing liquid on the plurality of anodes by ink jet printing to respectively obtain a plurality of metal nano self assembled layers;

Step S3, respectively forming a plurality of hole injection layers on the plurality of metal nano self assembled layers and respectively forming a plurality of light emitting layers on the plurality of hole injection layers; respectively forming a plurality of electron injection layers on the plurality of light emitting layers; respectively forming a plurality of cathodes on the plurality of electron injection layers; and respectively forming the plurality of organic light emitting diode elements in the plurality of through holes in the pixel definition layer.

8. The manufacturing method of the organic light emitting diode display panel according to claim 7, wherein in Step S1, the anodes are formed by magnetron sputtering and a material of the anodes is a transparent conductive metal oxide substance;

in Step S3, the hole injection layers and the light emitting layers are formed by ink jet printing; a material of the hole injection layers is PEDOT:PSS; a material of the light emitting layers comprises poly(9,9-noctylfluorene-2, 7-diyl);

in Step S3, the electron injection layers and the cathodes are formed by vacuum evaporation; a material of the electron injection layers comprises lithium fluoride; a material of the cathodes comprises aluminum.

* * * * *